(12) United States Patent
Park et al.

(10) Patent No.: US 12,410,347 B2
(45) Date of Patent: Sep. 9, 2025

(54) ADHESIVE COMPOSITION, AND COVERLAY FILM AND PRINTED CIRCUIT BOARD THAT INCLUDE THE SAME

(71) Applicant: DOOSAN CORPORATION, Seoul (KR)

(72) Inventors: Kwangseok Park, Yongin-si (KR); Euidock Ryu, Yongin-si (KR); Inki Jeong, Yongin-si (KR); Subyung Park, Yongin-si (KR); Dongho Chae, Yongin-si (KR)

(73) Assignee: DOOSAN CORPORATION, Seoul (KR)

( * ) Notice: Subject to any disclaimer, the term of this patent is extended or adjusted under 35 U.S.C. 154(b) by 363 days.

(21) Appl. No.: 17/910,703

(22) PCT Filed: Mar. 12, 2021

(86) PCT No.: PCT/KR2021/003091
§ 371 (c)(1),
(2) Date: Sep. 9, 2022

(87) PCT Pub. No.: WO2021/182910
PCT Pub. Date: Sep. 16, 2021

(65) Prior Publication Data
US 2023/0135423 A1    May 4, 2023

(30) Foreign Application Priority Data
Mar. 12, 2020  (KR) .................. 10-2020-0030846

(51) Int. Cl.
| | | |
|---|---|---|
| B32B 41/00 | (2006.01) | |
| C09J 7/30 | (2018.01) | |
| C09J 109/02 | (2006.01) | |
| C09J 163/00 | (2006.01) | |
| H05K 3/28 | (2006.01) | |

(52) U.S. Cl.
CPC ............ C09J 163/00 (2013.01); C09J 7/30 (2018.01); C09J 109/02 (2013.01); H05K 3/281 (2013.01)

(58) Field of Classification Search
CPC . C09J 163/00; C09J 7/30; C09J 109/02; C09J 2203/326; C09J 2409/00;
(Continued)

(56) References Cited

U.S. PATENT DOCUMENTS

| | | | |
|---|---|---|---|
| 7,524,563 B2 | 4/2009 | Nakanishi et al. | |
| 2013/0333838 A1* | 12/2013 | Plaut | B32B 37/14 156/60 |
| 2015/0307640 A1 | 10/2015 | Berlineanu et al. | |

FOREIGN PATENT DOCUMENTS

| | | |
|---|---|---|
| CN | 104379608 A | 2/2015 |
| JP | 2002-080812 A | 3/2002 |

(Continued)

OTHER PUBLICATIONS

Japanese Office Action dated Sep. 28, 2023 in JP Application No. 2022-554728.
(Continued)

*Primary Examiner* — Michael N Orlando
*Assistant Examiner* — Joshel Rivera
(74) *Attorney, Agent, or Firm* — Sughrue Mion, PLLC

(57) ABSTRACT

An adhesive composition, and a coverlay film and a printed circuit board that include the adhesive composition are disclosed. The adhesive composition includes: (a) an epoxy resin; and (b) a binder resin including epoxidized polybutadiene rubber and at least two kinds of rubber. The adhesive composition can form an adhesive layer superb in terms of adhesiveness, fluidity, filling properties (landfilling), migration resistance, heat resistance, flame retardancy, low elongation, and flexibility.

18 Claims, 2 Drawing Sheets

(58) Field of Classification Search
CPC ........ C09J 2463/00; C09J 7/35; C09J 163/08;
C09J 7/22; C09J 7/40; C09J 2301/312;
H05K 3/281; H05K 3/285; C08L 63/00;
C08L 9/02; C08L 23/16; C08L 23/22;
C08L 63/08; C08L 33/02; C08K 5/39;
C08K 2003/2241; C08K 3/16; C08K
5/548; C08K 5/47
USPC .................... 156/60, 64, 350, 351, 378, 379
See application file for complete search history.

(56) References Cited

FOREIGN PATENT DOCUMENTS

| | | | |
|---|---|---|---|
| JP | 2007-045882 | A | 2/2007 |
| JP | 2008-195846 | A | 8/2008 |
| JP | 5044414 | B2 | 7/2012 |
| KR | 10-2012-0066230 | A | 6/2012 |
| KR | 10-1385198 | B1 | 4/2014 |
| KR | 10-2015-0035738 | A | 4/2015 |
| KR | 10-2016-0065828 | A | 6/2016 |
| WO | 2007/063580 | A1 | 6/2007 |

OTHER PUBLICATIONS

International Search Report for PCT/KR2021/003091 dated Jul. 6, 2021 [PCT/ISA/210].
Extended European Search Report issued Feb. 1, 2024 in Application No. 21768377.0.

* cited by examiner

[Fig. 1]
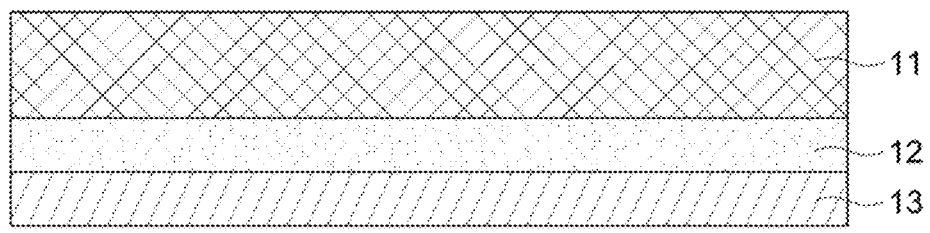
[Fig. 2]
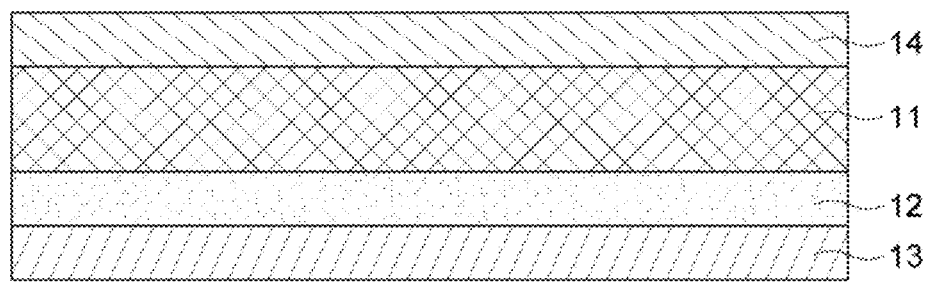

[Fig. 3a]    [Fig. 3b]
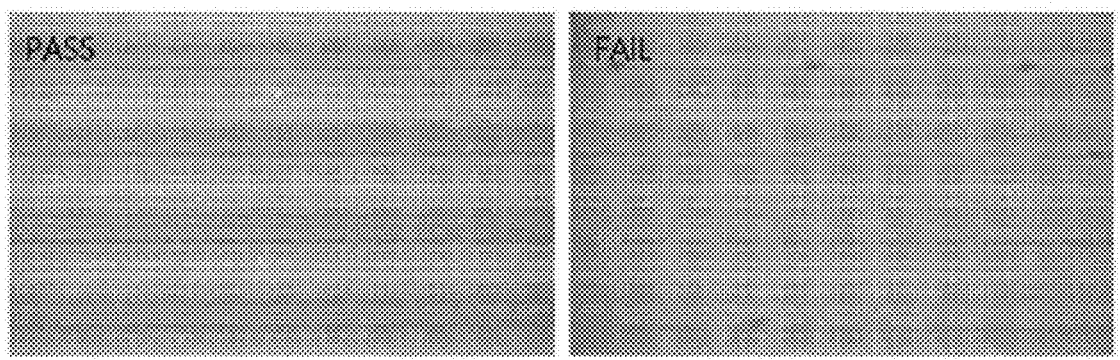
[Fig. 4]

ADHESIVE COMPOSITION, AND COVERLAY FILM AND PRINTED CIRCUIT BOARD THAT INCLUDE THE SAME

CROSS REFERENCE TO RELATED APPLICATIONS

This application is a National Stage of International Application No. PCT/KR2021/003091 filed Mar. 12, 2021, claiming priority based on Korean Patent Application No. 10-2020-0030846 filed Mar. 12, 2020.

TECHNICAL FIELD

The present disclosure relates to an adhesive composition, and a coverlay film and a printed circuit board, each including same.

BACKGROUND ART

A coverlay film is attached to a circuit pattern formation surface in order to protect a circuit pattern during the manufacturing process and use of the printed circuit board. Such a coverlay film includes a base and an adhesive layer.

An adhesive layer in conventional coverlay films is composed of an epoxy resin and a binder resin (e.g., NBR or acrylic rubber). Low fluidity of the adhesive layer in conventional coverlay films does not guarantee sufficiently fill (bury) an uneven surface of a printed circuit, giving rise to a quality problem that voids are generated at the interface between the adhesive layer of the coverlay film and the printed circuit board. In order to eliminate the voids, a hot press process needs to be conducted for a long time (ca. 1-2 hours) which leads to a decrease in productivity.

For enhancing the productivity, coverlay adhesives adapted for quick press of about 3 minutes have been developed, but conventional binder resins (e.g., NRB, acrylic rubber) alone failed to meet the requirement for both fluidity and thermal resistance. There is thus a limit to shortening the quick press time. Conventionally, it has been intended to improve the filling property by increasing the content of rubber which is a binder resin. Although a rubber can enhance the fluidity and adhesiveness of the adhesive layer, the physical properties of the rubber encounter the problem of provoking a decrease in thermal resistance, elongation, etc. when its amount exceeds a certain value. Thus, the content of a rubber is difficult to increase without measures. Particularly, when a roll-to-roll process is used for enhancing productivity, a decrease in elongation causes the greater accumulation of tolerance for longer products, culminating in a problem with the dimensions of the products.

DISCLOSURE OF INVENTION

Technical Problem

An aspect of the present disclosure is to provide an adhesive composition capable of forming an adhesive layer superb in terms of quick press, fluidity, filling property (landfilling), migration resistance, heat resistance, flame retardancy, low elongation, and flexibility, without degrading adhesiveness.

Another aspect of the present disclosure is to provide a coverlay film including the adhesive composition, which can shorten the time of a hot press process and enhance the applicability and reliability of a quick press process as well as the quality, productivity, and efficiency of a printed circuit board upon manufacture through a roll-to-roll process.

Solution to Problem

In order to accomplish the technical purpose, the present disclosure provides an adhesive composition containing: (a) an epoxy resin; and (b) a binder resin including an epoxidized polybutadiene rubber and two or more species of rubber.

In addition, the present disclosure provides a coverlay film including: a base substrate; an adhesive layer formed of the adhesive composition on the one surface of the base substrate; and a release substrate disposed on the adhesive layer.

Furthermore, the present disclosure provides a printed circuit board including: a board body; and the coverlay film disposed on at least one surface of the board body.

Advantageous Effects of Invention

The adhesive composition according to the present disclosure contains an epoxy resin, a binder resin, and a curing agent, wherein the binder resin includes an epoxidized polybutadiene rubber and two or more different rubbers, whereby the adhesive composition can form an adhesive layer superb in terms of adhesiveness, fluidity, filling properties (landfilling), migration resistance, heat resistance, flame retardancy, low elongation, and flexibility.

In addition, the coverlay film of the present disclosure includes an adhesive layer formed of the above-described adhesive composition and as such, can enhance hot press process efficiency upon the manufacture of printed circuit boards and reduce defective rates in the printed circuit boards, thus contributing to an improvement in the reliability of the printed circuit boards. Moreover, the coverlay film of the present disclosure can enhance the quality of the printed circuit board upon the manufacture of the printed circuit board through a roll-to-roll process.

BRIEF DESCRIPTION OF DRAWINGS

FIG. 1 is a schematic cross-sectional view of a coverlay film according to a first embodiment of the present disclosure.

FIG. 2 is a schematic cross-sectional view of a coverlay film according to a second embodiment of the present disclosure.

FIG. 3a is a photographic image of a coverlay film in which the adhesive layer is filled in between circuit patterns on a printed circuit board, with the filling property passed and FIG. 3b is a photographic image of a coverlay film in which the adhesive layer is not filled in between circuit patterns on a printed circuit board, with the filling property failed.

FIG. 4 is a plane view of a specimen for use in measuring elongation

DESCRIPTION FOR REFERENCE SYMBOLS 10A, 10B: Coverlay film, 11: Substrate
12: Adhesive layer, 13: Release film,
14: Surface protection film

MODE FOR CARRYING OUT THE INVENTION

Below, a description will be given of the present disclosure.

<Adhesive Composition>

An adhesive composition according to the present disclosure contains: (a) an epoxy resin; and (b) a binder resin including an epoxidized polybutadiene rubber and two different rubbers, and as need, at least one selected from the group consisting of a curing agent, a flame retardant, a dispersant, a silane coupling agent, an inorganic filler, a curing accelerator, an organic solvent, and an additive.

Hereinafter, individual components of the adhesive composition according to the present disclosure will be explained.

(a) Epoxy Resin

In the adhesive composition of the present disclosure, the epoxy resin is a thermosetting resin that is cured to form a three-dimensional net structure, thus not only improving the adhesiveness of the coverlay film to the printed circuit board, but also the heat resistance reliability of the coverlay film due to the superb heat resistance, water resistance, and moisture resistance thereof. In addition, the epoxy resin exhibits excellent performances in terms of mechanical strength, electric insulation, chemical resistance, dimensional stability, and moldability and is highly compatible with other resins.

In some particular embodiments, an epoxy resin available in the present disclosure is a polymer bearing at least one intramolecular epoxide group, with no intramolecular halogen atoms, such as bromine, etc. therein. In addition, the epoxy resin may contain silicon, urethane, polyimide, polyamide, etc. as well as phosphorus, sulfur, or nitrogen atom as intramolecular members.

Examples of the epoxy resin include, but are not limited to, glycidyl ether-based epoxy resins such as bisphenol A-type epoxy resins, bisphenol F-type epoxy resins, hydrogenated bisphenol A or F epoxy resins, phenolic novolac epoxy resins, and cresol novolac epoxy resins, glycidyl ester-based epoxy resins such as hexahydrophthalic acid glycidyl ester and dimeric acid glycidyl ester, glycidyl amine-based epoxy resins such as triglycidyl isocyanurate, and tetraglycidyl diaminodiphenylmethane, and linear aliphatic epoxy resins such as epoxidized polybutadiene and epoxidized soybean oil, with preference for bisphenol A-type epoxy resins, bisphenol F-type epoxy resins, phenolic novolac epoxy resins, cresol novolac epoxy resins, biphenyl epoxy resins, and multifunctional epoxy resins. They may be used alone or in combination.

According to an embodiment, the epoxy resin may be a multifunctional epoxy resin. Here, the multifunctional epoxy resin contains two or more, specifically two to five epoxy groups per molecule and as such, can endow the adhesive layer with electric insulation, heat resistance, chemical stability, toughness, and moldability.

Examples of the multifunctional epoxy resin include epoxy resins obtained by epoxidizing phenol- or alkyl phenol-hydroxybenzaldehyde condensates, phenolic novolac epoxy resins, cresol novolac epoxy resins, phenolaralkyl epoxy resins, biphenyl epoxy resins, bisphenol A-type epoxy resins, bisphenol F-type epoxy resins, linear aliphatic epoxy resins, alicyclic epoxy resins, heterocyclic epoxy resins, spiro ring-containing epoxy resins, xyloc epoxy resins, multifunctional epoxy resins, naphthol novolac epoxy resins, novolac epoxy resins of bisphenolA/ bisphenolF/bisphenolAD, glycidyl ether epoxy resins of bisphenolA/bisphenolF/bisphenolAD, bishydroxybiphenyl epoxy resins, dicyclopentadiene epoxy resins, and naphthalene epoxy resins, but are not limited thereto.

The epoxy resin may range in epoxy equivalent weight (EEW) from about 100 to 600 g/eq and specifically from about 300 to 600 g/eq, but with no limitations thereto. In this regard, an improvement can be brought about in the heat resistance and moldability of the adhesive composition as well as in the fluidity of a (semi-)cured product of the adhesive composition (e.g., adhesive layer of the coverlay film). Particularly, when mixed with NBR or acrylic rubber, which is a kind of binder resins, the epoxy resin with such a low epoxy equivalent as in the aforementioned range is further improved in fluidity whereby the adhesive layer of the coverlay film can fill inter-circuit steps on the printed circuit board within a short time.

No particular limitations are imparted to the content of the epoxy resin in the adhesive composition of the present disclosure. For instance, the epoxy resin may be used at a content of about 10 to 65 parts by weight, particularly about 20 to 46.5 parts by weight, and more particularly about 20 to 40 parts by weight, based on 100 parts by weight of a total of the epoxy resin and the binder resin. According to another embodiment, the content of the epoxy resin may range from about 5 to 50% by weight and particularly from about 5 to 35% by weight, based on the total weight of the adhesive composition. Given the range of content, the epoxy resin increases the fluidity of the adhesive composition whereby the adhesive layer is endowed with maximum filling ability, increased adhesiveness to copper foil, and enhanced thermal resistance.

(b) Binder Resin

The adhesive composition of the present disclosure contains a binder resin. The binder resin includes three or more different rubbers which reciprocally impart adhesive force thereamong not only to induce the composition to become a film, but also to improve adhesiveness, flexibility, and crack resistance and relieve heat stress in the cured substance (e.g., adhesive layer) after curing.

In particular, one of the three or more rubbers is an epoxidized polybutadiene rubber which can maintain the fluidity of the rubbers and allows for an epoxy reaction at the terminus thereof, thereby increasing the crosslinking density with the consequent improvement of all of adhesiveness, heat resistance, and flexibility.

In an embodiment, the binder resin includes an epoxidized polybutadiene rubber and two or more different rubbers which may include acrylonitrile-butadiene rubber (NBR) and an acrylic rubber.

In the binder resin of the present disclosure, the epoxidized polybutadiene rubber bears an epoxy group in the backbone thereof in which butadiene repeat units and epoxy group-bearing repeat units are included as constituents.

The butadiene repeat units may have at least one configuration selected from the group consisting of trans-1,4 cis-1,4, and 1,2-vinyl. In an embodiment, the butadiene repeat units may be composed of cis-1,4 and 1,2-vinyl configuration.

In the epoxidized polybutadiene rubber, the butadiene repeat units with cis-1,4 configuration have a linear structure with no branches. Thanks to this structure, the epoxidized polybutadiene rubber is more flexible than other rubbers. In addition, when blended with NBR to increase low-temperature flexibility, the epoxidized polybutadiene rubber exhibits fluidity at a lower temperature, compared to the NBR alone.

In addition, the reaction of the epoxidized polybutadiene rubber with a curing agent opens the ring in the epoxy-containing repeat units to increase the crosslinking density, whereby the epoxidized polybutadiene rubber can be provided with high heat resistance, low elongation, and high adhesiveness. In addition, the epoxy-containing repeat units in the epoxidized polybutadiene rubber makes sure high heat resistance in the adhesive composition, compared to the use of NBR or an acrylic rubber alone or in mixture, even though the total amount of the binder resin is increased.

In the butadiene repeat unit of the epoxidized polybutadiene rubber, the butadiene repeat unit with 1,2-vinyl configuration is an amorphous state. Due to this, an increased content of the butadiene repeat unit with 1,2-vinyl configuration makes an increased free volume between the polymer chains, resulting in an increase in the fluidity of the polymer chains and a decrease in the glass transition temperature of the epoxidized polybutadiene rubber.

According to an embodiment, the epoxidized polybutadiene rubber may be a rubber having at least one of repeat units represented by the following Chemical Formulas 1 to 3, respectively:

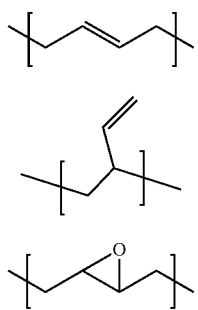

[Chemical Formula 1]

[Chemical Formula 2]

[Chemical Formula 3]

Specifically, the epoxidized polybutadiene rubber may be a rubber represented by Chemical Formula 4, below, but with no limitations thereto:

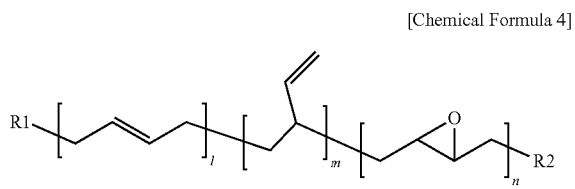

[Chemical Formula 4]

(wherein,
l is an integer of 1-500,
m is an integer of 1-500,
n is an integer of 1-500, and
R1 and R2 are same or different and each are independently selected from the group consisting of hydrogen and a C1-C12 alkyl).

The epoxidized polybutadiene rubber may have an epoxy equivalent weight (EEW) of about 100 to 400 g/eq.

When the epoxidized polybutadiene rubber is used alone, the cured substance (adhesive layer) formed from the adhesive composition may be poor in adhesiveness, fluidity, and filling property. In the present disclosure, the epoxidized polybutadiene rubber is used in combination with two or more different rubbers (e.g., acrylonitrile-butadiene rubber and acrylic rubber) as a binder resin.

In the binder resin of the present disclosure, the acrylonitrile-butadiene rubber (NBR) is a synthetic rubber which is a copolymer of acrylonitrile and butadiene. Acrylonitrile-butadiene rubber (NBR) is generally superb in terms of oil resistance, wear resistance, and anti-aging property and has a higher service temperature, compared to butadiene rubber, thereby allowing for high heat resistance. In addition, acrylonitrile-butadiene rubber can provide the adhesive layer with adhesiveness and heat resistance.

The content of acrylonitrile in the acrylonitrile-butadiene rubber is not particularly limited and may range, for example, from about 20 to 40% by weight. With the content range of acrylonitrile therein, the acrylonitrile-butadiene rubber ensures excellent heat resistance as a result of reaction with the epoxy resin. In addition, the reaction rate is easy to control at the content, which ensures processability and filling property in the adhesive layer. When the content of acrylonitrile is lower than 20% by weight, the rubber becomes poor in compatibility with a solvent. At an acrylonitrile content higher than 40% by weight, there may be a problem with insulation.

The acrylonitrile-butadiene rubber may bear at least one functional group selected from the group consisting of a carboxyl, an amino, an epoxy, a hydroxy, a methoxy, an isocyanate, and a vinyl at the terminal and/or side chain thereof. These functional groups may react with an epoxy resin to improve physical properties such as adhesiveness, moisture resistance, heat resistance, etc.

In an embodiment, the acrylonitrile-butadiene rubber may be an acrylonitrile-butadiene rubber bearing a carboxyl group at the terminus and/or side chain thereof (hereinafter referred to as "carboxyl-bearing NBR"). The carboxyl group in the carboxyl-bearing NBR increases the stability of the adhesive composition and enhances compatibility with other ingredients and processability in the adhesive composition. In addition, the carboxyl group in the carboxyl-bearing NBR can react with the epoxy resin, thereby increasing physical properties such as moisture resistance, heat resistance, etc., as well as adhesiveness.

No particular limitations are imparted to the content of carboxyl group in the carboxyl-bearing NBR. For example, the content may be about 0.5 to 2% by weight. In this regard, the content of acrylonitrile in the carboxyl-bearing NBR may range from about 20 to 40% by weight.

Furthermore, the carboxyl-bearing NBR may be a high-purity rubber containing ions such as $K^+$, $NH^{4+}$, $Na^+$, $Cl^-$ and so on at a content of about 0.1-20 ppm in total so as to confer migration resistance on the adhesive composition. Typical rubbers contain impurities such as the ions at a content of about 150 ppm. When a high-purity carboxyl-bearing NBR is employed, the migration of conductive ions into a metal layer is minimized, thereby producing a reliable product with excellent migration resistance. According to an embodiment, the carboxyl-bearing NBR may contain $Na^+$ ions at a content of about 5-15 ppm, $K^+$ ions at a content of about 2-5 ppm, and $Cl^-$ ions at a content of about 0.1-0.5 ppm.

In the binder resin of the present disclosure, the acrylic rubber is a synthetic rubber having a repeat unit derived from (meth)acrylate ester. When the coverlay film is brought about contact with a printed circuit board and then hot pressed against the printed circuit board at about 150-190° C. under a surface pressure of about 10-100 kgf/cm2 and a line pressure of about 2-20 kN, the acrylic rubber in a uncrosslinked or semi-crosslinked state can maximize, together with the epoxy resin, the fluidity of the adhesive layer. After thermosetting the adhesive layer, the acrylic rubber is completely crosslinked to enhance the adhesiveness, shear resistance, and elasticity of the adhesive layer.

The acrylic rubber may contain at least one functional group selected from the group consisting of a carboxyl, an amino, an epoxy, a hydroxy, a methoxy, an isocyanate, and a vinyl at the terminus and/or side chain thereof. The functional group reacts with an epoxy resin to enhance physical properties such as adhesiveness, moisture resistance, heat resistance, etc.

According to an embodiment, the acrylic rubber may be an acrylic rubber bearing a carboxyl group at the terminus and/or side chain thereof (hereinafter referred to as "carboxyl-bearing acrylic rubber").

No particular limitations are imported to the content of carboxyl group in the carboxyl-bearing acrylic rubber. For example, the content may be in the range of about 0.1 to 5% by weight.

So long as it is known in the art, any acrylic rubber may be available in the present disclosure. By way of examples, a homopolymer containing repeat units derived from (meth) acrylate ester; a copolymer containing repeat units derived from (meth)acrylate ester and repeat units derived from acrylonitrile; a copolymer containing repeat units derived from (meth)acrylate ester and repeat units derived from chlorine atom-bearing monomers may be used. In addition to the aforementioned repeat units, the copolymers may contain repeat units derived from monomers such as acrylic acid, methacrylic acid, glycidyl acrylate, glycidyl methacrylate, etc. Herein, the term "(meth)acrylate ester" refers to acrylate ester or methacrylate ester.

Examples of the (meth)acrylate alkyl ester include (meth) acrylate alkyl esters containing C1-C20 alkyls such as ethyl (meth)acrylate, n-propyl (meth)acrylate, n-butyl (meth) acrylate, isobutyl (meth)acrylate, sec-butyl (meth)acrylate, n-hexyl (meth)acrylate, 2-ethyl (meth) hexxylacrylate, n-octyl (meth) acrylate, isooctyl (meth)acrylate, n-nonyl (meth) acrylate, and n-decyl (meth)acrylate; conjugated diene monomers of 4-6 carbon atoms such as butadiene; and vinyl ethers such as vinylmethylether, vinylethylether, vinylpropylether, etc. they may be used alone or in combination.

The binder resin of the present disclosure may further a rubber generally known in the art without limitations, in addition to the epoxidized polybutadiene rubber, the acrylonitrile-butadiene rubber (NBR), and the acrylic rubber. For example, a natural rubber; and a synthetic rubber such as isoprene rubber, 1,2-polybutadiene, styrene-butadiene rubber (SBR), chloroprene rubber, butyl rubber, ethylene propylene rubber, chlorosulphonated polyethylene rubber, epichlorohydrine rubber, polysulfide rubber, silicone rubber, fluoro rubber, urethane rubber, and carboxyl-terminated butadiene acrylonitrile rubber (CTBN) may be used, but with no limitations thereto.

No particular limitations are imparted to the content of the additional rubber. It may be used in an amount of about 5% by weight or less, particularly about 3% by weight or less, more particularly about 0 to 1% by weight, and even more particularly about 0% by weight (exclusive) to 0.5% by weight (inclusive), based on the total amount of the binder resin.

In the adhesive composition of the present disclosure, the content of binder resin is not particularly limited. In an embodiment, the content may range from about 35 to 90 parts by weight, particularly from about 53.5 to 80 parts by weight, and more particularly from about 60 to 80 parts by weight, based on 100 parts by weight of a total of the epoxy resin and the binder resin. In another embodiment, the content of the binder resin may be about 25 to 55% by weight and particularly about 30 to 45% by weight, based on the total weight of the adhesive composition. In this regard, the adhesive composition has excellent fluidity and exhibits a maximum filling property and further improved adhesiveness.

The ratio (mixing ratio) between the epoxidized polybutadiene rubber and the two more different rubbers is not particularly limited and may be, for example, a weight ratio of 1:2-15. When the mixing ratio between the epoxidized polybutadiene rubber and the two or more rubbers is within the range, the cured substance (adhesive layer) formed from the adhesive composition is controlled to have a minimum viscosity of 1,000 to 10,000 cPs at about 150-200° C. Thus, the adhesive layer exhibits maximum fluidity and can exhibit an improved filling property upon hot pressing the coverlay film. Particularly, the adhesive composition of the present disclosure can shorten the time taken for a hot press process 3 to 5 times, compared to conventional adhesive compositions which do not contain an epoxidized polybutadiene rubber, thereby improving the process efficiency. In addition, the adhesive layer formed from the adhesive composition of the present disclosure is superb in terms of anti-migration property and flexibility as well as adhesiveness, heat resistance and electric insulation, thus enhancing the reliability of the coverlay film.

When the two or more different rubbers include acrylonitrile-butadiene rubber and acrylic rubber, the epoxidized polybutadiene rubber, the acrylonitrile butadiene rubber, and the acrylic rubber may be used at a weight ratio of 1:1-8: 0.5-5.

According to an embodiment, when the binder resin includes an epoxidized polybutadiene rubber, an acrylonitrile-butadiene rubber, and an acrylic rubber, the epoxidized polybutadiene rubber may be used at a content of about 3 to 20 parts by weight and particularly about 5 to 20 parts by weight, the acrylonitrile-butadiene rubber at a content of about 10 to 40 parts by weight and particularly about 20 to 35 parts by weight, and the acrylic rubber at a content of about 10 to 40 parts by weight and particularly about 10 to 20 parts by weight, based on 100 parts by weight of a total of the epoxy resin and the binder resin.

(c) Curing Agent

The adhesive composition of the present disclosure may further comprise a curing agent. The curing agent is a component that functions to cure the epoxy resin and the binder resin.

Any curing agent typically known in the art may be used in the present disclosure, as exemplified by acid anhydride-based curing agents, amine-based curing agent, and phenol-based curing agents.

Concrete examples of the curing agent include: acid anhydride curing agents such as tetrahydrophthalic anhydride, methyl tetrahydrophthalic anhydride, methyl hexahydrophthalic anhydride, hexahydrophthalic anhydride, trialkyl tetrahydrophthalic anhydride, methyl cyclohexene dicarboxylic anhydride, phthalic anhydride, maleic anhydride, pyromellitic anhydride, etc.; aromatic amine-based curing agents such as methaphenylene diamine, diaminodiphenyl methane, diaminodiphenyl sulphone, etc.; aliphatic amine-based curing agents such as diethylene triamine, triethylene tetraamine, etc.; phenol-based curing agents such as phenol aralkyl-type phenol resins, phenol novolac-type phenol resins, xyloc-type phenol resins, cresol novolac-type phenol resins, naphthol-type phenol resins, terpene-type phenol resins, multifunctional phenol resins, dicyclopentadiene-based phenol resins, naphthalene-type phenol resins, novolac-type phenol resin synthesized from bisphenol A and resole; and potential curing agents such as dicyandiamide, etc., but are not limited thereto. These curing agents may be used alone or in combination.

No particular limitations are imparted to the content of the curing agent. For example, the curing agent may be contained in an amount of about 1 to 10 parts by weight and particularly in an amount of about 1 to 6 parts by weight, based on 100 parts by weight of a total of the epoxy resin and the binder resin. In another embodiment, the content of the curing agent may range from about 0.5 to 10% by weight and particularly from about 1 to 5% by weight, based on the total weight of the adhesive composition.

(d) Flame Retardant

The adhesive composition according to the present disclosure may further include a flame retardant. The flame retardant confers flame retardancy on the adhesive composition.

So long as it is typically known in the art, any flame retardant may be used in the art without limitations thereto. For instance, halogen-based flame retardants (particularly, bromine-based flame retardant), organic phosphorus-based flame retardant, organic nitrogen-bearing phosphorus compounds, nitrogen compounds, silicon-based flame retardants, and metal hydroxides may be used. Concrete examples include: halogen-based flame retardants such as decabromdiphenylethan (e.g., Firemaster-2100R), hexabromobenzene, pentabromotoluene, hexabromobiphenyl, decabromobiphenyl, hexabromocyclodecane, decabromodiphenyl ether, octabromodiphenyl ether, hexabromodiphenyl ether, bis(pentabromophenoxy)ethane, ethylene-bis(tetrabromophthalimide), tetrabromobisphenol, poly(brominated benzyl acrylate), brominated polyphenylene ether, brominated bisphenol A, brominated (polystyrene), and poly(brominated styrene); nitrogen-phosphorus bearing flame retardants such as melamine phosphate, melamine pyrophosphate, ammonium polyphosphate, alkylamine phosphate, piperazine acid polyphosphate, and melamine polyphosphonate; nitrogen-bearing flame retardants such as melamine, melamine cyanurate, and triphenyl isocyanurate; and phosphorus-based flame retardants such as triphenyl phosphate (TPP), trixylenyl phosphate (TXP), tricresyl phosphate (TCP), resorcinyl diphenyl phosphate (RDP), phenyl diresorcinyl phosphate, cresyl diphenyl phosphate, xylenyldiphenyl phosphate, and phenyl di(isopropylphenyl) phosphate, with no limitations thereto. They may be used alone or in combination.

The content of the flame retardant is not particularly limited, but may be appropriately adjusted within a typical range known in the art. According to an embodiment, the flame retardant may be used at a content of about 20 to 50 parts by weight and particularly at a content of about 30 to 50 parts by weight, based on 100 parts by weight of a total of the epoxy resin and the binder resin. According to another embodiment, the content of the flame retardant may range from about 10 to 40% by weight, particularly from about 15 to 35% by weight, and more particularly from about 20 to 30% by weight, based on the total weight of the adhesive composition.

(e) Inorganic Filler

The adhesive composition according to the present disclosure may further include an inorganic filler. The inorganic filler can adjust melt viscosity as well as enhancing mechanical properties such as insulation, heat resistance, strength, etc., and low stress.

Non-limiting examples of the inorganic filler available in the present disclosure include: silica, such as natural silica, fused silica, amorphous silica, crystalline silica, and so on, aluminum hydroxide (ATH), boehmite, alumina, talc, glass (e.g., spherical glass), calcium carbonate, magnesium carbonate, magnesia, clay, calcium silicate, magnesium oxide (MgO), titanium oxide, antimony oxide, glass fiber, aluminum borate, barium titanate, strontium titanate, calcium titanate, magnesium titanate, bismuth titanate, titania (e.g., TiO2), barium zirconate, calcium zirconate, boron nitride, silicon nitride, talc, and mica. These inorganic fillers may be used alone or in combination. Among them, silica, alumina, and titania have low dielectric constants and as such, can reduce permittivity and dissipation factor in the resin layer while lowering a difference in thermal expansion coefficient between the resin layer and the metal layer.

Sizes (mean diameters), shapes, and contents of the inorganic filler are important parameters that have influence on characteristics of the adhesive layer.

In detail, the inorganic filler may range in mean diameter (D50) from about 1 to 15 μm and particularly from about 3 to 8 μm. These sizes are advantageous for dispersibility of the inorganic filler.

In addition, the shape of the inorganic filler is not particularly limited and may be, for example, sphere, flake, dendrite, cone, pyramid, or an amorphous form.

In the present disclosure, one species of inorganic fillers which are constant in shape and mean diameter may be used alone or two or more species of inorganic fillers which are different in shape and mean diameter may be used in mixture.

In the adhesive composition of the present disclosure, the content of the inorganic filler is not particularly limited, but may be appropriately adjusted in consideration of mechanical properties such as insulation, heat resistance, strength, etc., and low stress. However, an excessive amount of the inorganic filler degrades fluidity and filling property as well as adhesiveness in the adhesive layer. For example, the content of the inorganic filler may be about 1 to 20 parts by weight and particularly about 1 to 10 parts by weight, based on 100 parts by weight of a total of the epoxy resin and the binder resin. In another embodiment, the inorganic filler may be contained in an amount of about 0.5 to 10% by weight, particularly in an amount of about 1 to 7% by weight, and more particularly in an amount of about 1 to 5% by weight, based on the total weight of the adhesive composition.

(f) Curing Accelerator

The adhesive composition of the present disclosure may further include a curing accelerator as necessary. The curing accelerator is a catalyst for shortening a curing time so as to completely cure components in the adhesive composition. Any curing agent typically known in the art may be employed with no particular limitations thereto. For example, imidazole-based curing accelerators, phosphonium-based curing accelerators, amine-based curing accelerators, metal-based curing accelerators, etc. may be used alone or in mixture.

Non-limiting examples of the imidazole-based curing accelerator available in the present disclosure include imidazole, 2-methylimidazole, 2-ethylimidazole, 2-decylimidazole, 2-heptyl imidazole, 2-iso propylimidazole, 2-undecyl imidazole, 2-heptadecyl imidazole, 2-methyl-4-methyl imidazole, 2-ethyl-4-methyl imidazole, 2-phenylimidazole, 2-phenyl-4-methyl imidazole, 1-benzyl-2-methyl imidazole, 1-benzyl-2-phenyl imidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-cyanoethyl-2-undecyl-imidazole trimellitate, 1-cyanoethyl-2-phenyl imidazole trimellitate, 2,4-diamino-6-(2'-methylimidazole-(1')-ethyl-s-triazine, 2-phenyl-4,5-dihydroxy methylimidazole, 2-phenyl-4-methyl-5-hydroxymethyl imidazole, 2-phenyl-4-benzyl-5-hydroxymethylimidazole, 4,4'-methylene-bis-(2-ethyl-5-methylimidazole), 2-aminoethyl-2-methyl imidazole, 1-cyanoethyl-2-phenyl-4,5-di(cyanoethoxy methyl) imidazole, 1-dodecyl-2-methyl-3-benzylimidazolium chloride, and imidazole-containing polyamide.

Non-limiting examples of the phosphonium-based curing agent include benzyl triphenylphosphonium chloride, butyl triphenylphosphonium chloride, butyl triphenylphosphonium bromide, ethyl triphenylphosphonium acetate, ethyl triphenylphosphonium bromide, ethyl triphenylphosphonium iodide, tetraphenylphosphonium bromide, tetraphenylphosphonium chloride, and tetraphenylphosphonium iodide.

Non-limiting examples of the amine-based curing accelerator include triethylamine, triethylene diamine, tetramethyl-1,3-butanediamine, ethyl morpholine, diazabicycloundecene, and diazabicyclo nonene.

As the metal-based curing accelerators, organic metal complexes or organic metal salts of cobalt, copper, zinc, nickel, manganese, tin, etc. may be used. Examples of the organic metal complexes include organic cobalt complexes such as cobalt (II) acetylacetonate, cobalt (III) acetylacetonate, etc., organic copper complexes such as copper (II) acetylacetonate, etc., organic zinc complexes such as zinc (II) acetylacetonate, etc., organic iron complexes such as iron (III) acetylacetonate, etc., organic nickel complexes such as nickel (II) acetylacetonate, etc., organic manganese complexes such as manganese (II) acetylacetonate, etc., but are not limited thereto. Examples of the organic metal salt include zinc octoate, tin octoate, zinc naphthenate, cobalt naphthenate, tin stearate, zinc stearate, etc., but are not limited thereto.

The content of the curing accelerator is not particularly limited. For instance, the content may be about 0.001 to 10 parts by weight, particularly about 0.001 to 5 parts by weight, and more particularly about 0.01 to 1 part by weight, based on 100 parts by weight of a total of the epoxy resin and the binder resin. In another embodiment, the curing accelerator may be used in an amount of about 0.0001 to 10% by weight, particularly in an amount of about 0.01 to 5% by weight, and more particularly in an amount of about 1 to 3% by weight, based on the total weight of the adhesive composition.

(g) Solvent

The adhesive composition of the present disclosure may further include a solvent as necessary.

The solvent available in the present disclosure is not particularly limited as long as it can readily dissolve other substances without participation into reactions. Preferable is a solvent that can easily vaporize in a drying step. For instance, solvents of ketones, esters, alcohols, and esters known in the art may be used. More concrete examples of the solvent include toluene, xylene, methyl ethyl ketone, propylene glycol, monomethyl ether acetate, benzene, acetone, tetrahydrofuran, dimethyl formaldehyde, cyclohexanone, methanol, and ethanol. These solvents may be used alone or in combination thereof.

No particular limitations are imparted to the content of the solvent in the present disclosure. The solvent can control contents of solid components so that the adhesive composition in a liquid state has a viscosity of about 300 to 2,000 cps or less. For example, it is proper to adjust the solid content into a range of about 20 to 40% by weight. In another embodiment, the amount of the solvent may be a balance for 100% by weight of the adhesive composition.

Thus, the adhesive composition exhibits an improvement in coatability on the substrate of the coverlay film and thus in working efficiency. In addition, a uniform adhesive layer can be formed on the surface of the substrate.

(h) Additive

The adhesive composition according to the present disclosure may further include an additive typically known in the art, as needed, according to the use purpose and condition thereof in addition to the aforementioned ingredients. Examples of the additive include a rubber crosslinking agent, a silane coupling agent, a leveling agent, and an antistatic agent, but are not limited thereto.

The content of the additive is not particularly limited, but may be in a typical range. For example, the additive may be used in an amount of about 0.001 to 10 parts by weight, particularly about 0.01 to 5 parts by weight, and more particularly about 0.01 to 3 parts by weight, based on 100 parts by weight of a total of the epoxy resin and the binder resin. In another embodiment, the content of the additive may range from about 0.0001 to 10% by weight, particularly from about 0.01 to 5% by weight, and more particularly from about 0.1 to 3% by weight, based on the total weight of the adhesive composition.

So long as it is typically known in the art, any rubber crosslinking agent may be used without particular limitations. There are, for example, a vulcanizer, organic peroxide, and so on. It may be concretely exemplified by sulfur, di-(2,4-dichlorobenzoyl)-peroxide, dibenzoyl peroxide, 1,1-di-(tert-butylperoxy)-3,3,5-trimethylcyclohexane, butyl-4,4-di-(tert-butylperoxy) valerate, dicumyl peroxide, di-(2-tert-butyl-peroxyisopropyl)-benzene, 2,5-dimethyl-2,5-di(tert-butylperoxy)hexyne-3,2,5-dimethyl-2,5-di-(tert-butylperoxy)-hexane, tert-butyl peroxybenzoate, and di-tert-butylperoxide.

The content of the rubber crosslinking agent is not particularly limited, but may be in the range of about 0.1 to 20 parts by weight, particularly about 0.1 to 10 parts by weight, and more particularly about 1 to 5 parts by weight, based on 100 parts by weight of a total of the epoxy resin and the binder resin. In another embodiment, the rubber crosslinking agent may range in content from about 0.0001 to 10% by weight, particularly from about 0.01 to 5% by weight, and more particularly from about 0.1 to 3% by weight, based on the total weight of the adhesive composition.

No particular limitations are imparted to a silane coupling agent available in the present disclosure as long as it is known in the art. Examples of the silane coupling agent include epoxy-, methacryloxy-, amino-, vinyl-, mercapto-sulfide-, and ureido-based silane coupling agents. They may be used alone or in combination thereof. Such a silane coupling agent may improve adhesiveness between an inorganic filler and other ingredients when the adhesive composition is cured. For example, the silane coupling agent may be an epoxy-based silane coupling agent and among others, glycidyloxy($C_1$~$C_{20}$)alkyltri($C_1$~$C_{20}$)alkoxy silane. Examples of the silane coupling agent include 3-glycidoxypropyltrimethoxy silane, 2-(3,4 epoxycyclohexyl) ethyltrimethoxysilane, 2-(3,4 epoxycyclohexyl) ethyltriethoxysilane, 3-glycidoxypropyl triethoxysilane, 3-glycidoxypropyl methyldimethoxysilane, and 3-glycidoxypropyl methyldiethoxysilane.

The content of the silane coupling agent may be in the range of about 0.01 to 10 parts by weight and particularly in the range of about 0.1 to 5 parts by weight, based on 100 parts by weight of the inorganic filler, but with no limitations thereto. In another embodiment, the silane coupling agent may be used at a content of about 0.0001 to 10% by weight, particularly at a content of about 0.01 to 5% by weight, and more particularly at a content of about 0.1 to 3% by weight, based on the total weight of the adhesive composition.

Any leveling agent known in the art may be available in the present disclosure, without particular limitations. Mostly, a fluorine-based leveling agent may be used.

The content of the leveling agent is not particularly limited, but may be in a range typically known in the art. For example, the leveling agent may be used at a content of about 0.01 to 1 part by weight, based on 100 parts by weight of the total solid fraction. In another embodiment, the leveling agent may range in content from about 0.0001 to 10% by weight, particularly from about 0.01 to 5% by weight, and more particularly from about 0.1 to 3% by weight, based on the total weight of the adhesive compound.

So long as it is typically known in the art, any dispersant may be used in the present disclosure. Examples of the dispersant available for the present disclosure include: low-molecular weight, anionic compound such as fatty acid salts (soap), α-sulfofatty acid ester salt (MES), alkylbenzene sulfonate (ABS), linear alkylbenzen sulfonate (LAS), alkylsulfonate (AS), alkylether ester sulfonate (AES), alkyl sulfuric acid triethanol, etc.; low-molecular weight, non-ionic compounds such as fatty acid ethanol amide, polyoxyethylene alkyl ether (AE), polyoxyethylene alkylphenylether (APE), sorbitol, sorbitan, etc.; low-molecular weight, cationic compound such as alkyltrimethyl ammonium, dialkyldimethyl ammonium chloride, alkyl pyridinium chloride, etc.; and low-molecular weight, amphoteric compound such as alkylcarboxyl betaine, sulfobetaine, lecithin, etc.; and polymeric, aqueous dispersants such as naphthalene sulfonate-formalin condensates, polystyrene sulfonate, polyacrylate, copolymers of vinyl compounds and carboxylic monomers, carboxymethyl cellulose, polyvinyl alcohol, etc., but with no limitations thereto. In addition, commercially available are products from DIC (DaiNippon Ink & Chemicals), such as F-114, F-177, F-410, F-411, F-450, F493, F-494, F-443, F-444, F-445, F-446, F-470, F-471, F-472SF, F-474, F-475, F-477, F-478, F-479, F480SF, F-482, F-483, F-484, F-486, F-487, F-172D, MCF-350SF, TF-1025SF, TF-1117SF, TF-1026SF, TF-1128, TF-1127, TF-1129, TF-1126, TF-1130, TF-1116SF, TF-1131, TF1132, TF1027SF, TF-1441, TF-1442, and TF-1740. They may be used alone or in combination.

The content of the dispersant is not particularly limited and may be in a typical range known in the art. For example, the dispersant may be used in an amount of about 0.01 to 5 parts by weight and particularly in an amount of about 0.05 to 1 part by weight, based on 100 parts by weight of a total of the epoxy resin and the binder resin. In another embodiment, the content of the dispersant may range from about 0.0001 to 10% by weight, particularly from about 0.01 to 5% by weight, and more particularly from about 0.05 to 1% by weight, based on the total weight of the adhesive composition.

The adhesive composition according to the present disclosure may have a curing temperature of about 130° C. or higher and particularly of about 130 to 200° C.

The adhesive composition according to the present disclosure may have a viscosity of about 500-2,000 cps at room temperature (specifically at 25-30° C.). In this regard, the adhesive composition may have improved coatability, which leads to an increase in working efficiency, and can be formed into an adhesive layer constant in thickness on the surface of a substrate.

The adhesive composition of the present disclosure may be prepared using a method typically known in the art. For example, an adhesive composition may be prepared by mixing and stirring an epoxy resin; and a binder resin including an epoxidized polybutadiene rubber and two or more different rubbers (e.g., acrylonitrile-butadiene rubber and acrylic rubber); optionally together with a curing agent, an inorganic filler, a curing accelerator, a solvent, and an additive (e.g., rubber crosslinking agent, etc.), at room temperature to an appropriately elevated temperature in a mixing device, such as a ball mill, a bead mill, a 3-roll mill, a basket mill, a dyno mill, a planetary, etc.

The adhesive composition of the present disclosure is superb in terms of fluidity, filling property (landfilling), migration resistance, heat resistance, flame retardancy, low-elongation, flexibility, insulation, discoloration resistance, moisture resistance, chemical resistance, dimensional stability, and moldability as well as adhesiveness.

In an embodiment, the cured substance formed from the adhesive composition of the present disclosure may have an elongation rate of about 0.1 to 1.0% as measured by a test according to ASTM D1204. As such, the cured substance formed from the adhesive composition of the present disclosure, that is, the adhesive layer is poorly stretchable. When used in a roll-to-roll process for fabricating a printed circuit board, the adhesive layer guarantees the coverlay film excellent dimensional stability, thus improving in quality, productivity, and efficiency in the printed circuit board. Here, the cured substance formed from the adhesive composition may be in a partially to completely cured state and, for example, may have a degree of crosslinking (gelation) of about 40-80% and particularly about 40-70%.

In another embodiment, the cured substance formed from the adhesive composition of the present disclosure may have a minimum viscosity of about 1,000 to 10,000 cPs at about 150-200° C. With an excellent filling property of the coverlay film thereof, the coverlay film including the adhesive composition of the present disclosure can shorten the time taken for a hot press process 3 to 5 times, compared to conventional coverlay films and thus can improve the process efficiency.

In detail, the cured substance formed from the adhesive composition of the present disclosure may satisfy the following Relation Formula 1:

$$3 < \frac{T_1}{T_2} < 5 \qquad \text{[Relation Formula 1]}$$

(wherein, $T_1$ stands for a time taken for adhesive composition A to fill in between patterns on a printed circuit board upon hot pressing a cured substance formed from adhesive composition A against the printed circuit board at 180° C. under a pressure of 8800 LB; and $T_2$ stands for a time taken for the adhesive composition of the present disclosure to fill in between circuit patterns on a printed circuit board upon hot pressing a cured substance formed from the adhesive composition against the printed circuit board at 180° C. under a pressure of 8800 LB and particularly may be about 30 to 90 seconds;

wherein the adhesive composition A is identical to the adhesive composition of the present disclosure, with the exception of lacking the epoxidized polybutadiene rubber, and the circuit patterns on the printed circuit board have a thickness of 35 µm and a width of 100 µm, with a 100 µm spacing between adjacent circuit patterns).

In another embodiment, the cured substance formed from the adhesive composition of the present disclosure may have a peel strength of about 1.2 to 2.0 kgf/cm as measured according to a peel strength test (IPC-TM-650 2.4.8). As such, the cured substance formed from the adhesive composition of the present disclosure exhibits excellent adhesion properties.

<Coverlay Film>

The present disclosure provides a coverlay film employing the adhesive composition.

FIG. 1 is a schematic cross-sectional view of a coverlay film according to a first embodiment of the present disclosure and FIG. 2 is a schematic cross-sectional view of a coverlay film according to a second embodiment of the present disclosure.

The coverlay film (10A, 10B) according to the present disclosure, which is designed to protect a printed circuit board, specifically a circuit on a printed circuit board, includes: a base substrate (11); an adhesive layer (12) disposed on one surface of the substrate and formed of the adhesive composition; and a release film (13) disposed on the adhesive layer. Optionally, the coverlay film may further include a surface protection film (14) disposed on the other surface of the base substrate (11).

With reference to FIG. 1, the coverlay film (10A) according to a first embodiment of the present disclosure will be elucidated, below.

As shown in FIG. 1, the coverlay film (10A) according to a first embodiment of the present disclosure has a structure in which a base substrate (11), an adhesive layer (12), and a release film (13) are sequentially laminated.

(1) Base Substrate

In the coverlay film (10A) according to the present disclosure, the base substrate (11) is attached to the printed circuit board via the adhesive layer (12) to protect a circuit in the printed circuit board.

According to an embodiment, the base substrate (11) may be an insulative substrate. In this regard, the coverlay film may secure a low dielectric property.

So long as it is typically known in the art, any plastic film may be used as the base substrate (11), without limitations. Examples of the base substrate include polyester films, such as polyethylene terephthalate (PET), polybutylene terephthalate, polyethylene naphthalate, etc., polyethylene films, polypropylene films, cellophane, diacetyl cellulose films, triacetyl cellulose films, acetyl cellulose butyrate films, polyvinyl chloride films, polyvinylidene chloride films, polyvinyl alcohol films, ethylene-vinyl acetate copolymer films, polystyrene films, polycarbonate films, polymethylpentene films, polysulfone films, polyether ether ketone films, polyether sulfone films, polyether imide films, polyimide films, fluorine resin films, polyamide films, acrylic resin films, norbornene-based resin films, and cycloolefin resin films. Such a plastic film may be transparent or semi-transparent or may or may not be colored.

According to an embodiment, the base substrate (11) may be a thermoplastic polymer film with a melting point of about 300° C. or less and particularly about 150-300° C. Specifically, the base substrate (11) may be a polyethylene naphthalate (PEN) film. The excellent heat resistance of the adhesive layer can impart thermal stability to the thermoplastic polymer film having a low melting point.

The thickness of the base substrate is not particularly limited and may be, for example in the range of about 5 to 50 μm.

(2) Adhesive Layer

In the coverlay film (10A) according to the present disclosure, the adhesive layer (12) is disposed on one surface of the base substrate (11) to attach the coverlay film (10A) to the surface of the printed circuit board.

The adhesive layer (12) of the present disclosure is in a semi-cured or completely cured state and includes a cured substance formed from the adhesive composition. In this regard, the adhesive layer (12) may have a degree of crosslinking (gelation) of about 40-80%, and particularly about 40-70%.

In the present disclosure, the adhesive composition comprises an epoxy, a binder resin, and an inorganic filler, wherein the binder resin includes an epoxidized polybutadiene rubber and two or more different rubber (e.g., acrylonitrile-butadiene rubber and acrylic rubber). Thus, beings controlled to range in minimum viscosity from about 1,000 to 10,000 cPs at a temperature of 150-200° C., the adhesive layer of the present disclosure exhibits excellent fluidity and filling properties (landfilling).

As such, the adhesive layer (12) of the present disclosure can reduce a time of a hot press process by about 3-5 folds due to the excellent fluidity thereof, enhancing a process efficiency, compared to conventional coverlay films. In addition, exhibiting excellency in terms of filling performance within about 30-90 seconds (specifically 30-60 seconds), the adhesive layer (12) of the present disclosure can suppress a defective caused by a void between the coverlay film and the printed circuit board. In addition, the adhesive layer (12) of the present disclosure may have a peel strength of 1.2 to 2.0 kgf/cm as measured by a peel strength test according to the peel strength standard (IPC-TM-650 2.4.8). In addition, having low elongation and excellent dimensional stability as proven by the elongation rate of 0.1 to 1.0% according to ASTM D 1204 standard, the adhesive layer (12) of the present disclosure can contribute to an improvement of quality, productivity, and efficiency in the printed circuit board when the printed circuit board is manufactured through a roll-to-roll process. Furthermore, the adhesive layer (12) of the present disclosure is superb in migration resistance and discoloration resistance, thus allowing the coverlay film to protect the printed circuit board and minimizing the formation of a short circuit on the printed circuit board. In addition, the adhesive layer can improve the reliability of the printed circuit board due to the excellent heat resistance, moisture resistance, and chemical resistance thereof.

No particular limitations are imparted to the thickness of the adhesive layer. For example, the adhesive layer may be about 10-50 μm thick. Given the thickness range, the adhesive layer can enhance film formability, thickness uniformity, etc.

(3) Release Film

In the coverlay film (10A) according to the present disclosure, the release film (13) is disposed on the adhesive layer (12) to prevent the adhesive layer (12) to be contaminated with impurities from the outside environment before application of the coverlay film to the printed circuit board. The release film is released and removed before the coverlay film is applied to one or both sides of the printed circuit substrate.

So long as it is released without any damage on the adhesive layer (12), any release film known in the art may be used as the release film (13). For example, a fluorine release film, specifically a fluorosilicone release film containing a platinum catalyst, a fluorine release film having a fluorine curing agent and an adhesive additive mixed with each other, etc. may be used.

No particular limitations are imparted to the release power of the release film. For example, the release power of the release film against the adhesive layer may be about 20 to 150 gf/inch as measured according to ASTM D3330.

In addition, the thickness of the release film is not particularly limited. For example, the thickness ratio of the release film (T2) to the adhesive layer (T3) (T3/T2) may be about 1 to 5.

Below, the coverlay film (10B), shown in FIG. 2, according to a second embodiment of the present disclosure will be elucidated.

As shown in FIG. 2, the coverlay film (10B) according to the second embodiment of the present disclosure comprises: a base substrate (11); an adhesive layer (12) disposed on one surface of the base substrate and formed of the adhesive composition; a release film (13) disposed on the adhesive layer (12); and a surface protection film (14) disposed on the other surface of the base substrate (11).

Since the base substrate (11), the adhesive layer (12), and the release film (13) in the coverlay film (10B) according to the second embodiment are the same as in the first embodiment, elucidations thereof are omitted.

In the coverlay film (10B) according to the second embodiment, the surface protection film (14) is disposed on the other surface (specifically, the outside surface) of the base substrate (11), to prevent the base substrate (11) from being contaminated with external foreign matter and to protect the surface of the film, particularly the surface of the substrate when the coverlay film is attached to the printed circuit board by a hot press process. This surface protection film (14) may be released and eliminated, as necessary, upon application of the coverlay film to the printed circuit board.

Any protection film typically known in the art may be used as the surface protection film, without particular limitations. Examples of the surface protection film include polyester films such as polyethylene terephthalate (PET), polybutylene terephthalate, polyethylene naphthalate, etc., polyethylene films, polypropylene films, cellophane, diacetyl cellulose films, triacetyl cellulose films, acetyl cellulose butyrate films, polyvinyl chloride films, polyvinylidene chloride films, polyvinyl alcohol films, ethylene-vinyl acetate copolymer films, polystyrene films, polycarbonate films, polymethylpentene films, polysulfone films, polyether ether ketone films, polyether sulfone films, polyether imide films, polyimide films, polycyclohexylene dimethylene terephthalate, fluorine resin films, polyamide films, acrylic resin films, norbornene-based resin films, and cycloolefin resin films, but are not limited thereto.

In addition, at least one surface of the surface protection film (14), specifically the surface in contact with the base substrate (11) may be matt. In this regard, the matt surface of the surface protection film (14) may have a release power of about 30 to 150 gf/inch against the base substrate. This surface protection film (14) may be easily peeled off and removed from the coverlay film after the coverlay film is attached to a flexible printed circuit board.

Furthermore, the thickness of the surface protection film is not particularly limited and may be, for example, about 20 to 150 μm and specifically about 80 to 120 μm.

The coverlay films (10A, 10B) of the present disclosure may be prepared using a typical method known in the art, except for the formation of the adhesive layer from the adhesive composition.

In the method for preparing a coverlay film according to an embodiment of the present disclosure, the adhesive composition is applied to one surface of the base substrate and thermally set to form an adhesive layer and a release film is then disposed and laminated on the adhesive layer, followed by laminating a surface protection film on the other surface of the base substrate, as necessary.

The adhesive composition may be coated using a typical coating method known in the art, for example, dip coating, air knife coating, curtain coating, wire bar coating, gravure coating, comma coating, slot coating, extrusion coating, spin coating, slit scanning, and inkjet coating.

The thermosetting process may be appropriately carried out in a typical condition known in the art. For example, thermosetting may be conducted for about 5-10 min at about 130° C. or higher (particularly about 130-200° C. and more particularly about 130-150° C.). The adhesive layer formed through the thermosetting process is in a semi-cured state with a degree of crosslinking of about 40-80%.

As described above, the coverlay film of the present disclosure comprises an adhesive layer superb in adhesiveness, fluidity, filling property (landfilling), low-elongation, migration resistance, discoloration resistance, heat resistance, moisture resistance, and chemical resistance and, upon manufacture of a printed circuit board, thus can enhance the efficiency of the hot press process, decrease the defective rate of the printed circuit board, and increase the reliability of the printed circuit board. In addition, the coverlay film of the present disclosure can contribute to an improvement of quality, productivity, and efficiency in the printed circuit board upon the manufacture of the printed circuit board through a roll-to-roll process.

<Printed Circuit Board>

The present disclosure provides a printed circuit board comprising the coverlay film described above.

According to an embodiment, the printed circuit board of the present disclosure comprises: a board body; and the coverlay film (10A, 10B) disposed on at least one surface of the board body. In this regard, the adhesive layer (12) of the coverlay film (10A, 10B) exhibits excellent fluidity and filling properties. Thus, voids between the coverlay film (10A, 10B) and the board body are about 0% as inspected for appearance by a 60× magnification microscope. In addition, the printed circuit board of the present disclosure exhibits excellent reliability because of the superb heat resistance, moisture resistance, and discoloration resistance of the coverlay film (10A, 10B).

A better understanding of the present disclosure may be obtained via the following examples which are set forth to illustrate, but are not to be construed as limiting the present disclosure.

Example 1

1-1. Preparation of Adhesive Composition

An adhesive composition was prepared by mixing the ingredients according to the compositions listed in Table 1, below. In Table 1, the content units are % by weight for epoxy resin, epoxidized polybutadiene rubber (EBR), acrylonitrile butadiene rubber (NBR), acrylic resin (AR), curing accelerator, inorganic filler, flame retardant, dispersant, silane-based coupling agent, and curing agent, and are based on the total weight of the adhesive composition. Specifications of the raw material components in composition of Table 1 are given as shown in table 3, below.

1-2. Preparation of Coverlay Film

The adhesive composition prepared in Example 1-1 was applied to one surface of a polyethylene terephthalate film (thickness: about 50 μm), which is a base substrate, followed by thermosetting at about 150° C. for about 5 min to form an adhesive layer (degree of crosslinking: about 40%, thickness: about 38 μm). Thereafter, a fluorine-based release film (thickness: about 116 μm) was laminated on the adhesive layer to afford a coverlay film.

Examples 2-4 and Comparative Examples 1-12

Adhesive compositions and coverlay films of Examples 2-4 and Comparative Examples 1-12 were prepared in the same manner as in Example 1, with the exception of mixing individual ingredients according to the compositions listed in Tables 1-2. Specifications of the raw material components in each composition of Tables 1 and 2 are given as shown in Table 3, below.

TABLE 1

|   |    | Example |      |      |      | Comparative Example |      |      |      |
|---|----|---------|------|------|------|---------------------|------|------|------|
|   |    | 1       | 2    | 3    | 4    | 1                   | 2    | 3    | 4    |
| A | A1 | 30      | 30   | 30   | 40   | 20                  | —    | —    | 15   |
|   | A2 | —       | —    | —    | —    | —                   | 20   | —    | 5    |
|   | A3 | —       | —    | —    | —    | —                   | —    | 20   | —    |
| B | B1 | 20      | 20   | 20   | 20   | 30                  | 30   | 30   | 30   |
|   | B2 | 10      | 10   | 10   | 10   | 10                  | 10   | 10   | 10   |
|   | B3 | 5       | 10   | 15   | 15   | —                   | —    | —    | —    |
|   | B4 | —       | —    | —    | —    | —                   | —    | —    | —    |
| C |    | 0.1     | 0.1  | 0.1  | 0.1  | 0.1                 | 0.1  | 0.1  | 0.1  |
| D |    | 2.35    | 2.35 | 1.85 | 2.85 | 2.85                | 2.85 | 2.85 | 2.85 |
| E | E1 | 25      | 20   | 15   | 5    | 30                  | 30   | 30   | 30   |
|   | E2 | 3       | 3    | 3    | 3    | 3                   | 3    | 3    | 3    |
| F |    | 0.05    | 0.05 | 0.05 | 0.05 | 0.05                | 0.05 | 0.05 | 0.05 |
| G |    | 1       | 1    | 1    | 1    | 1                   | 1    | 1    | 1    |
| H |    | 3.5     | 3.5  | 4    | 3    | 3                   | 3    | 3    | 3    |

TABLE 2

|   |    | Comparative Example |      |      |      |      |      |       |      |
|---|----|---------------------|------|------|------|------|------|-------|------|
|   |    | 5                   | 6    | 7    | 8    | 9    | 10   | 11    | 12   |
| A | A1 | 15                  | 20   | 20   | 20   | 20   | 30   | 30    | 40   |
|   | A2 | —                   | —    | —    | —    | —    | —    | —     | —    |
|   | A3 | 5                   | —    | —    | —    | —    | —    | —     | —    |
| B | B1 | 30                  | —    | 10   | 30   | —    | 30   | 15    | 30   |
|   | B2 | 10                  | —    | —    | —    | —    | 10   | 15    | 10   |
|   | B3 | —                   | —    | —    | —    | 40   | —    | —     | —    |
|   | B4 | —                   | 40   | 30   | 10   | —    | —    | —     | —    |
| C |    | 0.1                 | 0.1  | 0.1  | 0.1  | 0.1  | 0.1  | 0.1   | 0.1  |
| D |    | 2.85                | 7.85 | 7.85 | 7.85 | 7.35 | 2.35 | 11.85 | 1.85 |
| E | E1 | 30                  | 25   | 25   | 25   | 25   | 20   | 20    | 10   |
|   | E2 | 3                   | 3    | 3    | 3    | 3    | 3    | 3     | 3    |
| F |    | 0.05                | 0.05 | 0.05 | 0.05 | 0.05 | 0.05 | 0.05  | 0.05 |
| G |    | 1                   | 1    | 1    | 1    | 1    | 1    | 1     | 1    |
| H |    | 3                   | 3    | 3    | 3    | 3.5  | 3.5  | 4     | 4    |

TABLE 3

| Component |                             |    | Specification                                          |
|-----------|-----------------------------|----|--------------------------------------------------------|
| A         | Epoxy resin                 | A1 | BPA epoxy resin [YD-011 (EEW 450-500) from Kukdo Chemical] |
|           |                             | A2 | BPA epoxy resin [YD-128 (EEW 184~190) from Kukdo Chemical] |
|           |                             | A3 | BPA epoxy resin [YD-014 (EEW 900~1000) from Kukdo Chemical] |
| B         | Binder resin                | B1 | Acrylonitrile-butadiene rubber (NBR)                   |
|           |                             | B2 | Acrylic rubber                                         |
|           |                             | B3 | EBR (Epoxidized Polybutadiene Rubber)                  |
|           |                             | B4 | Polyester                                              |
| C         | Curing accelerator          | C  | 2E4Mz from Evonik                                      |
| D         | Inorganic filler            | D  | $TiO_2$                                                |

TABLE 3-continued

| Component |                        |    | Specification                                          |
|-----------|------------------------|----|--------------------------------------------------------|
| E         | Flame retardant        | E1 | Brome-based flame retardant [Firemaster-2100R from Chemtura] |
|           |                        | E2 | Melapur-200                                            |
| F         | Dispersant             |    | F-477 from DIC (Dainippon Ink and Chemicals)           |
| G         | Silane-based coupling agent |    | SilquestA-187                                     |
| H         | Curing agent           |    | DDS (diaminodiphenylsulfone)                           |

[Experimental Example 1]—Evaluation for Physical Property

Physical properties of the coverlay films prepared in Examples 1-6 and Comparative Examples 1-12 were evaluated as follows, and the results are shown in Tables 4-5, below.

1) Peel Strength (P/S)

A coverlay film (release film removed) was hot pressed against a copper foil (35 μm thick with a size of 5 cm×5 cm) at 160° C. under a pressure of 5,700 LB for 1 hour to prepare a specimen. Then, the specimen was measured for 180° peel strength at a rate of 50.8 mm/min according to the method of IPC-TM-650 2.4.8.

2) Solder Floating (S/F)

A coverlay film (release films removed) was hot pressed against a printed circuit board (circuit patterns: 35 μm in thickness, 100 μm in width, and 100 μm in spacing therebetween) at a temperature of 160° C. under a pressure of 5,700 LB for 1 hour sec to prepare a specimen. Thereafter, the specimen was floated for 10 sec in a solder bath maintained at 260° C. and then examined for the occurrence of blaster or interlayer delamination on the appearance thereof to evaluate the heat resistance of the adhesive layer in the coverlay film. Here, if there was no blaster/delamination on the appearance of the product, it was indicated as "Pass"; otherwise, it was indicated as "Fail".

3) Reflow (@ 260° C.)

A coverlay film (release film removed) was hot pressed against a copper foil (35 μm thick with a size of 5 cm×5 cm) at 160° C. under a pressure of 5,700 LB for 1 hour to prepare a specimen. Then, the specimen was subjected to reflow at 240° C. for 30 sec. After the reflow, if there was no blaster/delamination on the appearance of the product, it was indicated as "Pass"; otherwise, it was indicated as "Fail".

4) Filling Property

A coverlay film (release film removed) was hot pressed against a printed circuit board (circuit patterns: 35 μm in thickness, 300 μm in width, and 100 μm in spacing therebetween) at a temperature of 180° C. under a pressure of 8,800 LB (see FIG. 3). The time points at which spaces between patterns of the printed circuit boards were filled with the adhesive layers of the coverlay films were determined while the coverlay films were pressed over time. FIG. 3a is a photographic image of a coverlay film in which the adhesive layer is filled in between circuit patterns on a printed circuit board, with the filling property passed. FIG. 3b is a photographic image of a coverlay film in which the adhesive layer is not filled in between circuit patterns on a printed circuit board, with the filling property failed.

5) Elongation

A coverlay film (release film removed) was cut into a size of 200 mm×300 mm to prepare a specimen. As shown in FIG. 4, holes were drilled in the four corners of the prepared specimen with a drill (diameter: 1 mm or less). Thereafter, the distances (A-B, C-D, A-C, and B-D) between the holes were measured using a 3D measuring device (see FIG. 4). The specimen was heated at 150° C. for 30 min in an oven and then stabilized at room temperature (23° C., 50%) for 24 hours. After stabilization of the specimen, distances between the holes were measured and elongation was calculated according to Equation 1, below.

[Equation 1]

$$\text{Elongation}(\%) = \frac{\frac{(A-B)_F - (A-B)_I}{(A-B)_I} + \frac{(C-D)_F - (C-D)_I}{(C-D)_I}}{2} \times 100$$

(wherein,
$(A-B)_F$ is a distance A-B in the specimen after heating in the oven,
$(A-B)_I$ is a distance A-B in the specimen before heating in the oven,
$(C-D)_F$ is a distance C-D in the specimen after heating in the oven, and
$(C-D)_I$ is a distance C-D in the specimen before heating in the oven).

6) Flame Retardancy

Evaluation was made according to the UL-94 VTM test, as follows.

A coverlay film specimen with a size of 200 mm×50 mm was prepared and wrapped around a mandrel (diameter: 12 mm). Then, the specimen was taped on one end and fixed with a clamp. The fixed specimen was brought into contact with flames from a burner for three seconds twice. The specimen was evaluated for flame retardancy in terms of flammability. In this regard, flame retardancy was expressed 0 for VTM-0 level, Δ for VTM-1 level, and X for VTM-2 level.

The invention claimed is:

1. An adhesive composition, comprising:
   (a) an epoxy resin; and
   (b) a binder resin including an epoxidized polybutadiene rubber and two or more species of rubber,
   wherein the two or more species of rubber comprise an acrylonitrile butadiene rubber (NBR) and an acrylic rubber.

2. The adhesive composition of claim 1, wherein the epoxidized polybutadiene comprises repeat units represented by the following Chemical Formulas 1 to 3:

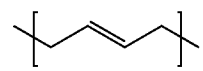

[Chemical Formula 1]

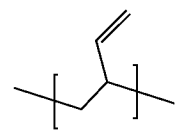

[Chemical Formula 2]

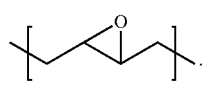

[Chemical Formula 3]

3. The adhesive composition of claim 1, wherein the epoxidized polybutadiene rubber is a rubber represented by the following Chemical Formula 4:

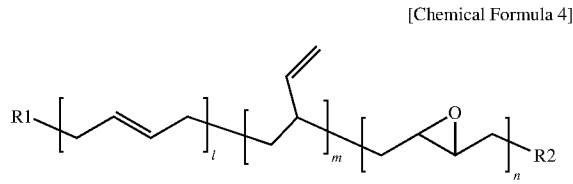

[Chemical Formula 4]

TABLE 4

| Property | Example | | | | Comparative Example | | | |
|---|---|---|---|---|---|---|---|---|
| | 1 | 2 | 3 | 4 | 1 | 2 | 3 | 4 |
| P/S (kgf/cm) | 1.8 | 2.0 | 1.6 | 1.7 | 0.9 | 0.8 | 0.9 | 0.8 |
| S/F (@260° C.) | Pass | Pass | Pass | Pass | Pass | Fail | Pass | Fail |
| Reflow (@260° C.) | Pass | Pass | Pass | Pass | Fail | Fail | Pass | Fail |
| Filling (sec) | 30 | 30 | 60 | 120 | 90 | 60 | >600 | 90 |
| Elongation (%) | 0.1 | 0.05 | 0.03 | 0.3 | 0.3 | 0.4 | 0.2 | 0.3 |
| Flame retardancy | ○ | ○ | Δ | X | ○ | ○ | ○ | ○ |

TABLE 5

| Property | Comparative Example | | | | | | | |
|---|---|---|---|---|---|---|---|---|
| | 5 | 6 | 7 | 8 | 9 | 10 | 11 | 12 |
| P/S (kgf/cm) | 0.9 | 1.7 | 1.3 | 0.9 | 0.7 | 1.4 | 1.2 | 1.6 |
| S/F (@260° C.) | Pass | Fail | Fail | Pass | Pass | Pass | Pass | Pass |
| Reflow (@260° C.) | Pass | Fail | Fail | Fail | Fail | Fail | Pass | Pass |
| Filling (sec) | 120 | 30 | 60 | 60 | 90 | 120 | 150 | 120 |
| Elongation (%) | 0.3 | 1 | 0.8 | 0.5 | 0.2 | 0.3 | 0.3 | 0.3 |
| Flame retardancy | ○ | ○ | ○ | ○ | ○ | ○ | ○ | X |

(wherein,
l is an integer of 1-500,
m is an integer of 1-500,
n is an integer of 1-500, and
R1 and R2 are same or different from each other and each are independently selected from the group consisting of hydrogen and a $C_1$-$C_{12}$ alkyl.

4. The adhesive composition of claim 1, wherein the binder resin comprises the epoxidized polybutadiene rubber and the two or more species of rubber at a weight ratio of 1:2-15.

5. The adhesive composition of claim 1, wherein the binder resin comprises the epoxidized polybutadiene rubber, the acrylonitrile butadiene rubber, and the acrylic rubber at a weight ratio of 1:1-8:0.5-5.

6. The adhesive composition of claim 1, wherein a cured substance formed from the adhesive composition has an elongation of 0.1 to 1% as measured by according to ASTM D1204.

7. The adhesive composition of claim 1, wherein a cured substance formed from the adhesive composition ranges in minimum viscosity from 1,000 to 10,000 cPs at 150-200° C.

8. The adhesive composition of claim 7, wherein the cured substance formed from the adhesive composition satisfies the following Relation Formula 1:

$$3 < \frac{T_1}{T_2} < 5 \qquad \text{[Relation Formula 1]}$$

wherein,
T₁ stands for a time taken for reference adhesive composition A to fill in between patterns on a printed circuit board upon hot pressing a cured substance formed from the reference adhesive composition A against the printed circuit board at 180° C. under a pressure of 8800 LB; and T₂ stands for a time taken for a subject adhesive composition to fill in between circuit patterns on a printed circuit board upon hot pressing a cured substance formed from the subject adhesive composition against the printed circuit board at 180° C. under a pressure of 8800 LB, wherein the subject adhesive composition comprises (a) an epoxy resin, and a binder resin including an epoxidized polybutadiene rubber and two or more species of rubber, said two or more species of rubber comprising an acrylonitrile butadiene rubber (NBR) and an acrylic rubber;

wherein the reference adhesive composition A is identical to the subject adhesive composition of, with the exception of lacking the epoxidized polybutadiene rubber, and wherein the circuit patterns on the printed circuit board have a thickness of 35 µm and a width of 100 µm, with a 100 µm spacing between adjacent circuit patterns.

9. A coverlay film, comprising:
a base substrate;
an adhesive layer formed of the adhesive composition of claim 1 on the one surface of the base substrate; and
a release substrate disposed on the adhesive layer,
wherein the adhesive composition comprises:
(a) an epoxy resin; and
(b) a binder resin including an epoxidized polybutadiene rubber and two or more species of rubber,
wherein the two or more species of rubber comprise an acrylonitrile butadiene rubber (NBR) and an acrylic rubber.

10. The coverlay film of claim 9, wherein the base substrate is a thermoplastic polymer film having a melting point of 300° C. or less.

11. A printed circuit board, comprising:
a board body; and
the coverlay film of claim 9, disposed on at least one surface of the board body.

12. The coverlay film of claim 9, wherein the epoxidized polybutadiene comprises repeat units represented by the following Chemical Formulas 1 to 3:

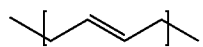

[Chemical Formula 1]

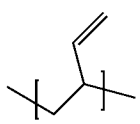

[Chemical Formula 2]

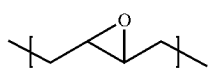

[Chemical Formula 3]

13. The coverlay film of claim 9, wherein the epoxidized polybutadiene rubber is a rubber represented by the following Chemical Formula 4:

[Chemical Formula 4]

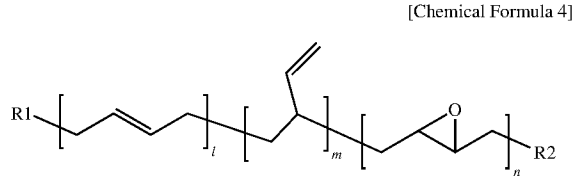

wherein,
l is an integer of 1-500,
m is an integer of 1-500,
n is an integer of 1-500, and
R1 and R2 are same or different and each are independently selected from the group consisting of hydrogen and a $C_1$-$C_{12}$ alkyl.

14. The coverlay film of claim 9, wherein the binder resin comprises the epoxidized polybutadiene rubber and the two or more species of rubber at a weight ratio of 1:2-15.

15. The coverlay film of claim 9, wherein the binder resin comprises the epoxidized polybutadiene rubber, the acrylonitrile butadiene rubber, and the acrylic rubber at a weight ratio of 1:1-8:0.5-5.

16. The coverlay film of claim 9, wherein a cured substance formed from the adhesive composition has an elongation of 0.1 to 1% as measured by according to ASTM D1204.

17. The coverlay film of claim 9, wherein a cured substance formed from the adhesive composition ranges in minimum viscosity from 1,000 to 10,000 cPs at 150-200° C.

18. The coverlay film of claim 17, wherein the cured substance formed from the adhesive composition satisfies the following Relation Formula 1:

$$3 < \frac{T_1}{T_2} < 5 \qquad \text{[Relation Formula 1]}$$

wherein, $T_1$ stands for a time taken for a reference adhesive composition A to fill in between patterns on a printed circuit board upon hot pressing a cured substance formed from the reference adhesive composition A against the printed circuit board at 180° C. under a pressure of 8800 LB; and $T_2$ stands for a time taken for a subject adhesive composition to fill in between circuit patterns on a printed circuit board upon hot pressing a cured substance formed from the subject adhesive composition against the printed circuit board at 180° C. under a pressure of 8800 LB, wherein the subject adhesive composition comprises (a) an epoxy resin, and a binder resin including an epoxidized polybutadiene rubber and two or more species of rubber, said two or more species of rubber comprising an acrylonitrile butadiene rubber (NBR) and an acrylic rubber;

wherein the reference adhesive composition A is identical to the subject adhesive composition, with the exception of lacking the epoxidized polybutadiene rubber, and wherein the circuit patterns on the printed circuit board have a thickness of 35 μm and a width of 100 μm, with a 100 μm spacing between adjacent circuit patterns.

* * * * *